US007733115B2

(12) United States Patent
Chen et al.

(10) Patent No.: US 7,733,115 B2
(45) Date of Patent: Jun. 8, 2010

(54) SUBSTRATE TESTING CIRCUIT

(75) Inventors: Yupeng Chen, Beijing (CN); Zhenhuan Tian, Beijing (CN); Kiyoung Kwon, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/126,307

(22) Filed: May 23, 2008

(65) Prior Publication Data

US 2009/0146678 A1 Jun. 11, 2009

(30) Foreign Application Priority Data

Dec. 7, 2007 (CN) ........................ 2007 1 0178946

(51) Int. Cl.
*G01R 31/00* (2006.01)
*G06K 5/04* (2006.01)

(52) U.S. Cl. ....................................... 324/770; 714/700

(58) Field of Classification Search ......... 324/754-765, 324/770; 714/700
See application file for complete search history.

(56) References Cited

U.S. PATENT DOCUMENTS 5,754,158 A * 5/1998 Misawa et al. .............. 345/100
7,456,647 B2 11/2008 Joen et al

FOREIGN PATENT DOCUMENTS

CN 1900802 A 1/2007

* cited by examiner

*Primary Examiner*—Ernest F Karlsen
(74) *Attorney, Agent, or Firm*—Ladas & Parry LLP

(57) ABSTRACT

The present invention relates to a substrate testing circuit comprising a testing bus and a testing signal terminal connected to the testing bus, a signal line to be tested in the substrate being connected to the testing bus via a signal connecting terminal, wherein a plurality of signal access terminals are provided on the testing bus; one testing branch is connected between each the signal access terminal and the testing signal terminal; and resistance values of the testing branches are the same. By means of the present invention, since a plurality of signal access terminals are introduced and the testing branches with the same resistance are added so that input resistances and impedances of testing signals across the display screen are substantially identical without making changes to process flow and device hardware structure, input resistances and impedances of respective signal lines are well averaged, thereby no obvious regional attenuation occurs in the testing signals within the pixel area to be tested irrespective of limitation in size of panel, so as to realize tests for panels with greater sizes.

11 Claims, 4 Drawing Sheets

SUBSTRATE TESTING CIRCUIT

TECHNICAL FIELD

The present invention relates to a substrate testing circuit, and particularly to a circuit for testing a signal on an array substrate of a Liquid Crystal Display (LCD).

BACKGROUND ART

Manufacture of an existing Thin Film Transistor (TFT) LCD involves an array process phase where an array substrate is formed on which there are several separated TFT pixel array circuits. The pixel array is required to be tested after being formed by deposit. A specific testing method is to deposit a testing circuit for inputting a testing signal together with the pixel array onto a glass substrate, with the testing circuit being located peripherally to each pixel area. Having completed the test, the testing circuit is removed in a cutting procedure of a Cell process.

FIG. 1 shows a prior art testing circuit in which gate lines 1 and data lines 2 are leaded from peripheral of pixel areas, among which odd lines and even lines are leaded, respectively, to connect with a testing signal terminal of the testing circuit via a testing bus. In particular, the odd lines of gate lines 1 are connected with a gate testing odd terminal GO (Gate Odd) via a gate testing odd bus 11; the even lines of gate lines 1 are connected with a gate testing even terminal GE (Gate Even) via a gate testing even bus 12; the odd lines of data lines 2 are connected with a data testing odd terminal DO (Data Odd) via a data testing odd bus 21; and the even lines of data lines 2 are connected with a data testing even terminal DE (Data Even) via a data testing even buses 22. In the testing circuit, in addition to the above four testing signal terminals, a common electrode terminal Vcom (Common) is included for testing a common electrode 3.

During testing, a device obtains input signals by connecting a probe pin with respective testing signal terminals integrated on the glass substrate, while a modulator move transversely (left-right) over the glass substrate by 15 um to receive surface electric fields of pixel areas thereby deciding whether each pixel functions normally, so as to implement the test.

Defects of the prior art include: since resistances of the lead lines of the testing circuit integrated on the glass substrate are great, when the above testing circuit is applied to a large size LCD, an obvious attenuation occurs in the testing signals in a direction from the testing signal terminals along the bus due to voltage dividing effect and resistance-capacitance delay (RC Delay) effect of the resistance of the lead lines, such that testing signals are too low in some parts of the display screen. Therefore, the voltages of the testing signals on the entire display screen are non-uniform and thus the test result is degraded. Especially, the non-uniformity in the voltages of the testing signals makes more contribution to this situation. Below, taking the even lines of the data lines 2 as an example, the detailed reasons of generating the voltage dividing effect and the RC delay effect are explained in connection with FIG. 2. The principle for the problem incurred by the gate lines 1 and the odd lines of the data lines 2 is similar and thus omitted.

1. The Voltage Dividing Effect

A certain leaking current exists between the data testing even bus 22 and the common electrode 3 as shown by dash lines in FIG. 2. Although this leak current is weak, in case where number of the signal lines 2 is relative great, length of the data testing even bus 22 increases significantly and the resistance R thereof increases accordingly. Thus a part of voltage is consumed over the data testing even bus 22, such that a signal voltage measured on a data line 2 far away from the data testing even terminal DE must be relatively low, which causes attenuation in the signals of this area and non-uniformity in the voltages of the testing signals.

As shown in FIG. 2, provided number of data lines 2 is n, a voltage drop between the leftmost data line and the rightmost data line may be calculated by the following formula $$\Delta V=R*i*n+R*i*(n-1)+R*i*(n-2)+\ldots+R*i$$

Where ΔV represents the voltage drop, i stands for the leaking current, and R denotes the resistance value between signal connecting terminals on the data testing even bus 22 as to every two adjacent data lines 2. It can be seen from the above formula, the more the resistances Rs are, the greater the voltage drop ΔV is and the more non-uniform the signal voltages are.

2. The RC Delay Effect

As shown in FIG. 2, after passing through the pixel area, the data line 2 connect at an end thereof to the common electrode in a form of a static-electric-proof ring, and can be deemed as open at this time. Since internal structures of respective data lines 2 in the pixel areas are same, difference among the RC delays depends totally on difference among peripheral testing circuits. According to calculation formula for circuit impedance, in case where capacitance and induction are same, the RC delays of respective signal lines increase as the resistance in the circuit increases. The resistance increases gradually from the input terminal to another terminal of the data testing even bus 22, leading to an increase in the RC delay accordingly. Thus, the signals of the data lines far away from the data testing even terminal DE arrive by a delay so that TFT devices can not be charged fully in a limited scanning period, resulting in attenuation in the signals.

In attenuation process of the testing signals, although it has not been verified that which one of the voltage dividing effect and the RC delay effect is dominant, a primary reason causing attenuation in the signals must be one of them which are desiderated to be solved.

Besides, to overcome the above problems, as shown in FIG. 3, in the prior art, a solution of wiring at both ends of the glass substrate to add signals from the both sides may be employed. As shown in FIG. 4, this solution may reduce errors to a certain degree, but still has defects as follows 1. Modification to the testing circuit is not downright enough, and there remain some situations such as unbalance in input resistances, so limitation as to panel size still exists and panels of and above 32 inches cannot be tested; and 2. Symmetrical input mode has to be utilized when carrying out this solution. That is, two input terminals, left and right, are required for the signals. This leads to such problems that, firstly, due to limitation in principles of testing devices, it is impossible to know whether input terminal pads 6 on both sides are all in good contact with the probe pins 5 of the device; secondly, as shown in FIG. 4, due to use of the symmetrical input mode, a beam 8 with a probe pin is required to be added in the middle of a device probe frame 7. Since the distance between the modulator and the glass substrate is only 15 um during the testing, the modulator has to be lifted up once when passing the beam 8, resulting in an increase in tact time and deterioration of manufacture capacity.

SUMMARY OF THE INVENTION

A problem to be overcome by the present invention is that voltage values of testing signals are non-uniform due to great differences among transmitting distances of the testing signals at different locations when a signal test is performed on a large size substrate.

To overcome the above problem, one embodiment of the present invention provides a substrate testing circuit comprising a testing bus and a testing signal terminal connected to the testing bus, a signal line to be tested in the substrate being connected to the testing bus via a signal connecting terminal, wherein a plurality of signal access terminals are provided on the testing bus; one testing branch is connected between each of the signal access terminal and the testing signal terminal; and resistance values of the testing branches are same.

By the present invention, since a plurality of signal access terminals are introduced and the testing branches with the same resistance are added so that input resistances and impedances of testing signals across a display screen are substantially identical without making changes to process flow and device hardware structure. Therefore, the input resistances and impedances of the signal lines are well averaged and no obvious regional attenuation occurs in the testing signals within the pixel area to be tested irrespective of limitation as to panel size, thereby implementing tests for panels with greater sizes.

Technical solutions of the present invention will be further described in conjunction with figures and particular embodiments.

DETAILED DESCRIPTION OF THE PREFERRED EMBODIMENTS

Unless indicated otherwise, throughout the application documents of the present application, terminologies “a”, “an”, and “the” refer to “one or a plurality of” and similarly, the component/element/means/module/unit/device and like described in a single form herein refer to “one or a plurality of such component/element/means/module/unit/device and like” and vice versa. Unless indicated otherwise, terminologies “include”, “comprise” and “contain” and their variants refer to “comprise but not limit to” throughout the application documents of the present application. Unless indicated otherwise, terminologies “an embodiment”, “the embodiment”, “embodiments”, “the embodiments”, “present embodiment”, “present embodiments”, “one or more embodiments” and “some embodiments” refer to one or more (but not all) embodiments throughout the application documents of the present application.

The present invention provides a substrate testing circuit comprising a testing bus and a testing signal terminal connected to the testing bus, and a signal line to be tested in the substrate is connected to the testing bus via a signal connecting terminal. Depending on the signal line to be tested, the testing bus and the testing signal terminal may be different. To facilitate the explanation, by way of example, the description herein is made by supposing the signal line to be tested is a data line. However, when the signal line to be tested is a gate line, the structure is substantially same.

Figure 1:
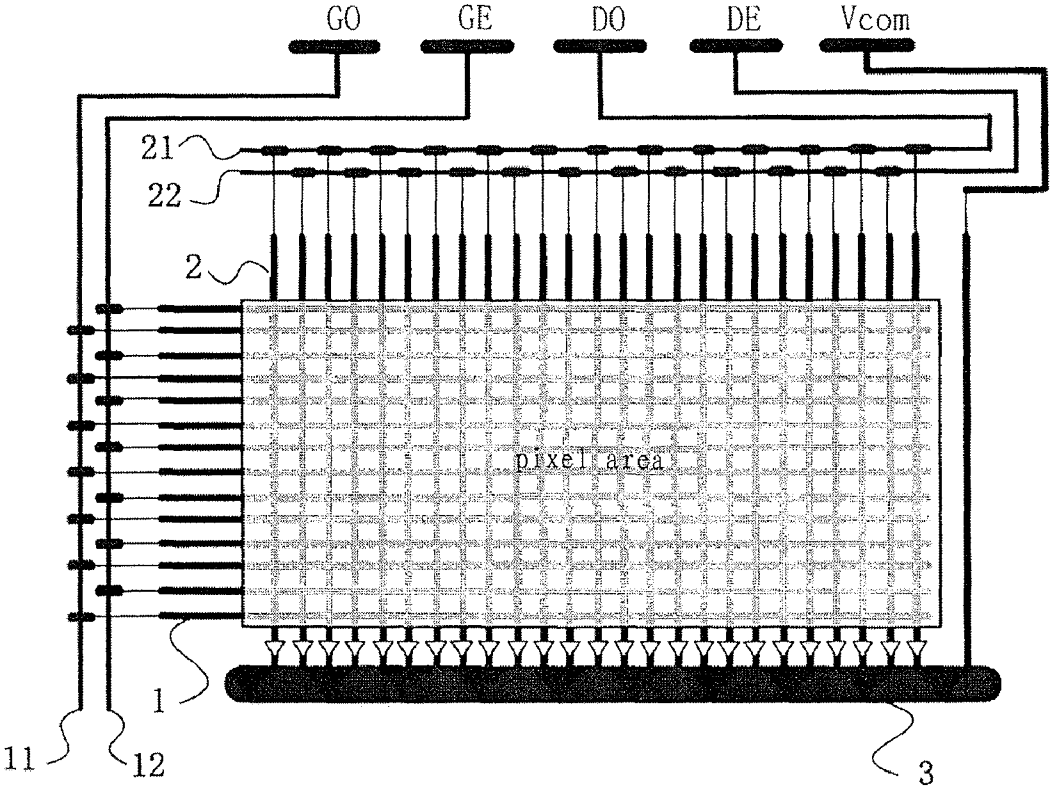
FIG. 1 is a structurally schematic diagram of a related art substrate testing circuit.
Figure 2:
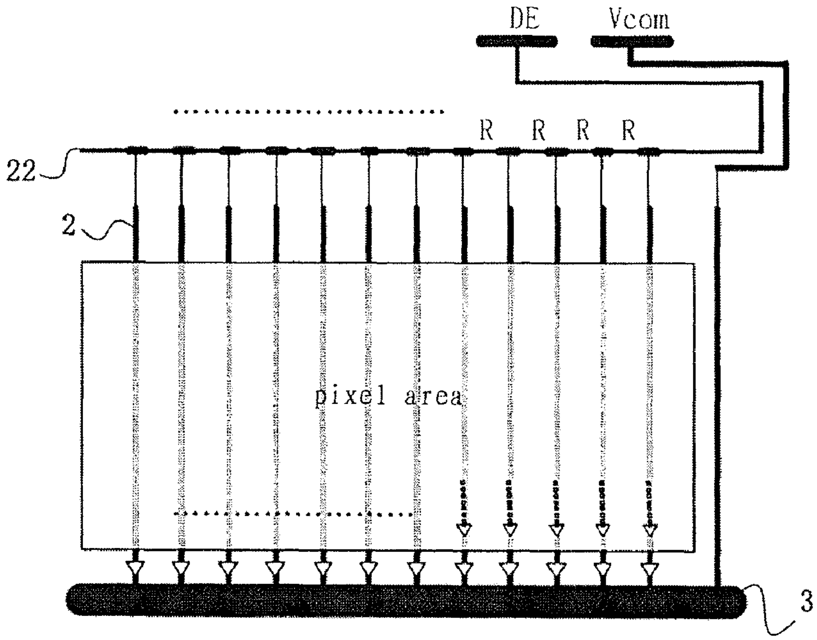
FIG. 2 is a schematic diagram of principle of generating the voltage dividing effect and the RC delay effect in the related art substrate testing circuit.
Figure 3:
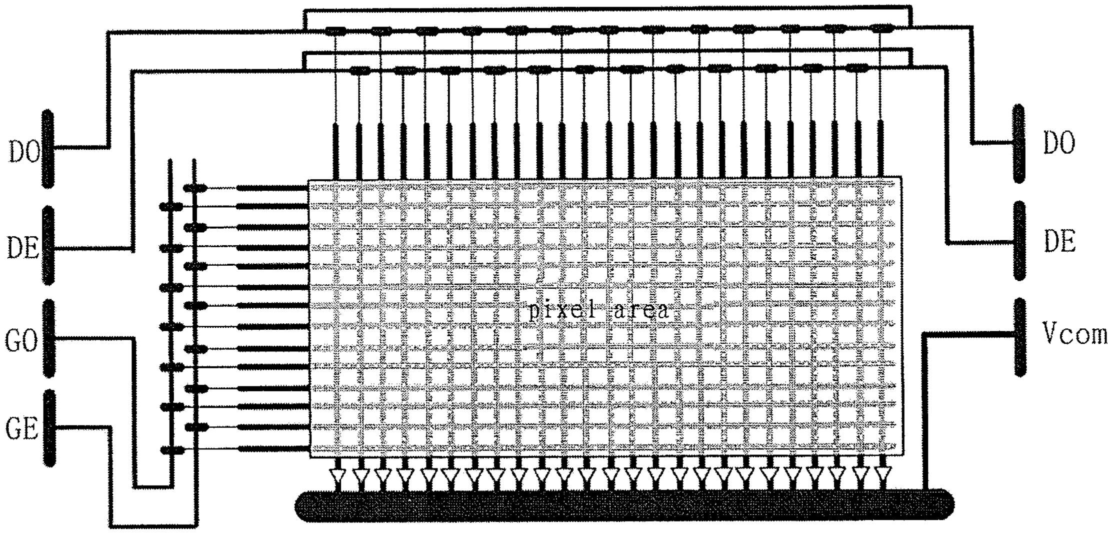
FIG. 3 is structurally schematic diagram of a related art substrate testing circuit with lines wired on both sides.
Figure 4:
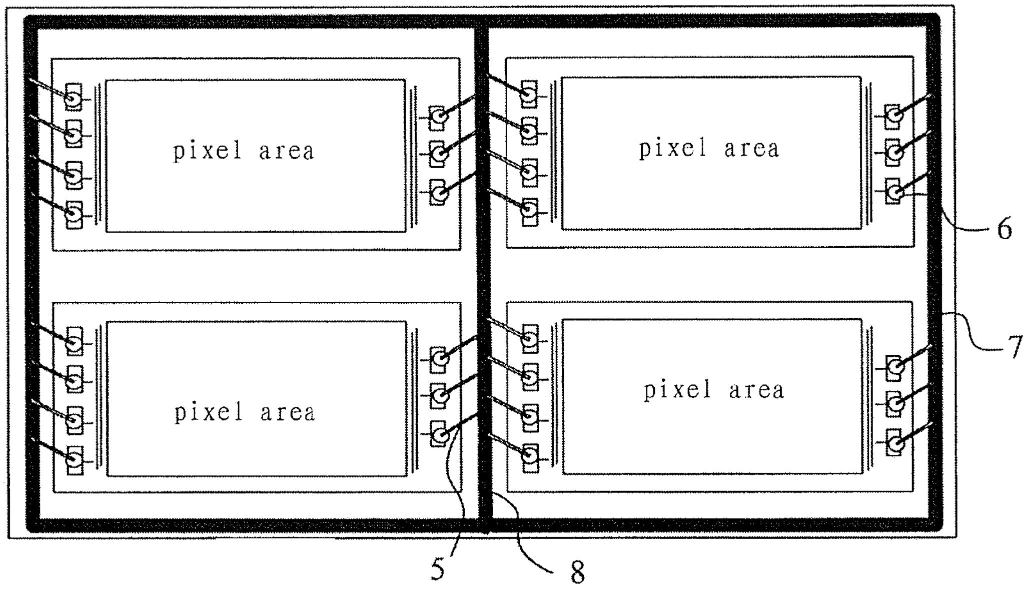
FIG. 4 is a schematic diagram of testing principle of the substrate testing circuit shown in FIG. 3.
Figure 5:
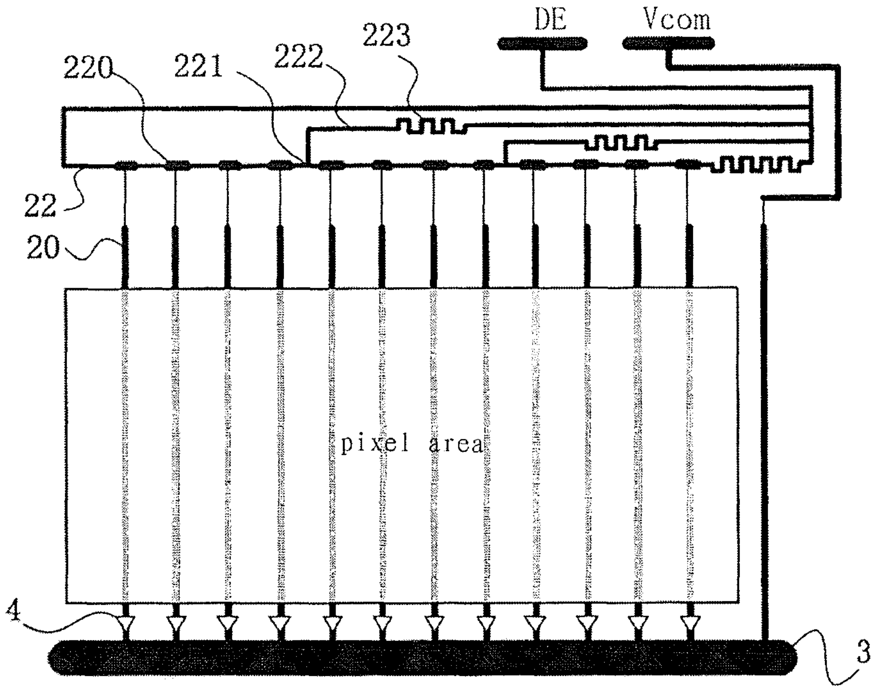
FIG. 5 is a partial structurally schematic diagram of a substrate testing circuit according to an embodiment of the present invention.

As shown in FIG. 5, the signal lines to be tested in the substrate are data lines 2, and specifically, even lines of the data lines 2, i.e. data even lines 20. Accordingly, the testing bus is a data testing bus and specifically, a data testing even bus 22. The data even lines 20 are connected to the data testing even bus 22 via multiple signal connecting terminals such as signal connecting terminals 220. The testing signal terminal is a data testing terminal, and specifically, a data testing even terminal DE. Hereinafter, in the substrate testing circuit, explanation is made on the circuit structure when the tested signal lines are the data even lines 20, and when the tested signal lines are the odd lines, the principle is same.

In FIG. 5, multiple signal access terminals, such as a signal access terminal 221, are provided on the data testing even bus 22. A testing branch, such as a testing branch 222, is connected between each signal access terminal and the data testing even terminal DE. Resistance values of the testing branches are same. In particular, widths and lengths of the respective testing branches may be varied so that each testing branch has the same resistance. The explanation is given by example of varying the lengths of the testing branches below. The principle of varying the widths of the testing branches is similar and thus omitted.

As shown in FIG. 5, zigzag paths, such as a zigzag path 223, with different lengths are on respective testing branches. The zigzag paths are part of the testing branches and shaped in zigzag. The lengths of the zigzag paths on different branches are different from each other and may be determined according to the lengths of the testing branches such that the resistances in the respective testing branches are same.

Furthermore, in practice, when the bus length is very small, the influence of its voltage dividing effect and RC delay effect may be ignored, that is, the voltages of the input signals on this section of the testing bus can be considered to be uniform. Thus, preferably, the bus lengths between two adjacent signal access terminals on the data testing even bus 22 may be made less than 40 cm.

Here, it is to be noted that when the signal line to be tested in the substrate is a gate line, accordingly, the testing bus is a gate testing bus, and the testing signal terminal is a gate testing terminal. In particular, similar to the data lines 2, the gate lines 1 may include gate odd lines and gate even lines, that is, odd lines and even lines among the gate lines 1. Accordingly, the gate testing buses may include a gate testing bus 11 and a gate testing even bus 12, and the gate testing terminals may be a gate testing odd terminal GO and a gate testing even terminal GE. The gate odd lines and the gate testing odd terminal GO are connected to the gate testing odd bus 11. The gate even lines and the gate testing even terminal GE are connected to the data testing even bus 12.

Similar to the structure of the substrate testing circuit shown in FIG. 5, multiple signal access terminals may be provided on the gate testing bus. A testing branch is connected between each signal access terminal and the gate testing terminal. Resistance values of the testing branches are same. In particular, widths and lengths of the testing branches may be varied so that each testing branch has the same resistance.

For example, a zigzag path may be provided on each testing branch so that the zigzag paths on different testing branches have different lengths such that resistances in respective testing branches are same.

Figure 6:
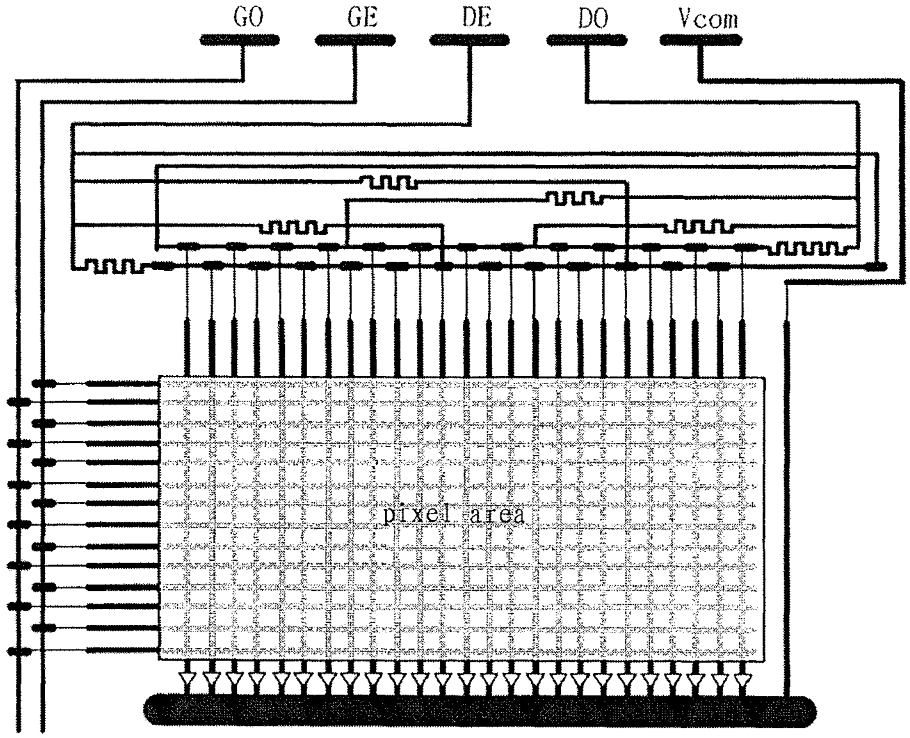
FIG. 6 is a complete structurally schematic diagram of the substrate testing circuit according to an embodiment of the present invention.

According to a general substrate structure, with respect to the gate lines 1, the number of the data lines 2 would be greater and distribution distances thereof are longer, so the problem of signal attenuation occurs more easily. Therefore, the substrate testing circuit of the present embodiment is preferable to be applied to the data lines 2, and whether to apply the above testing circuit structure to the gate lines 1 depends on a specific situation. When the structure of adding the signal access terminals is not employed in the gate lines 1, the complete structure of the testing circuit is shown in FIG. 6. Further, when uniformity of the signals is improved, if total input resistance of the testing circuit is higher comparing to the existing implementation, the absolute voltage of the testing signal may be increased slightly or the scanning period of TFTs may be fine tuned to increase average voltage value of the panel, so as to achieve a desired testing condition.

In addition, the substrate testing circuit of the present embodiment may further comprise a common electrode terminal Vcom to connect with a common electrode 3 of the substrate in order to test signals on the common electrode 3.

Furthermore, the substrate testing circuit of the present embodiment may further comprise a static-electric-proof ring 4 via which each of the data lines 2 is connected with the common electrode 3. The static-electric-proof ring 4 may be a TFT device with a special structure in that each data line is designed to be source and gate of the TFT device at the same time, and this TFT device is made to have a very high turn-on voltage. Then, in general cases, the signal voltages on the data lines are relatively low and the TFT device is not turned on. However, when very high static voltage is generated in the data lines due to static-electrical effect, the TFT device is turned on instantly such that the static electricity is released to a broad common electrode region. Thus probability of static electric damage to the data lines may be reduced, resulting in static-electric-proof.

By means of the circuit structure of the present embodiment, by introducing multiple signal access terminals and adding the testing branches with the same resistance so that input resistances and impedances of testing signals across a display screen are substantially identical without making changes to a process flow and a device hardware structure, the input resistances and impedances of respective signal lines are well averaged and therefore no obvious regional attenuation occurs in the testing signals within the pixel area to be tested irrespective of limitation in size of panel, so as to realize tests for panels with greater sizes.

Figure 7:
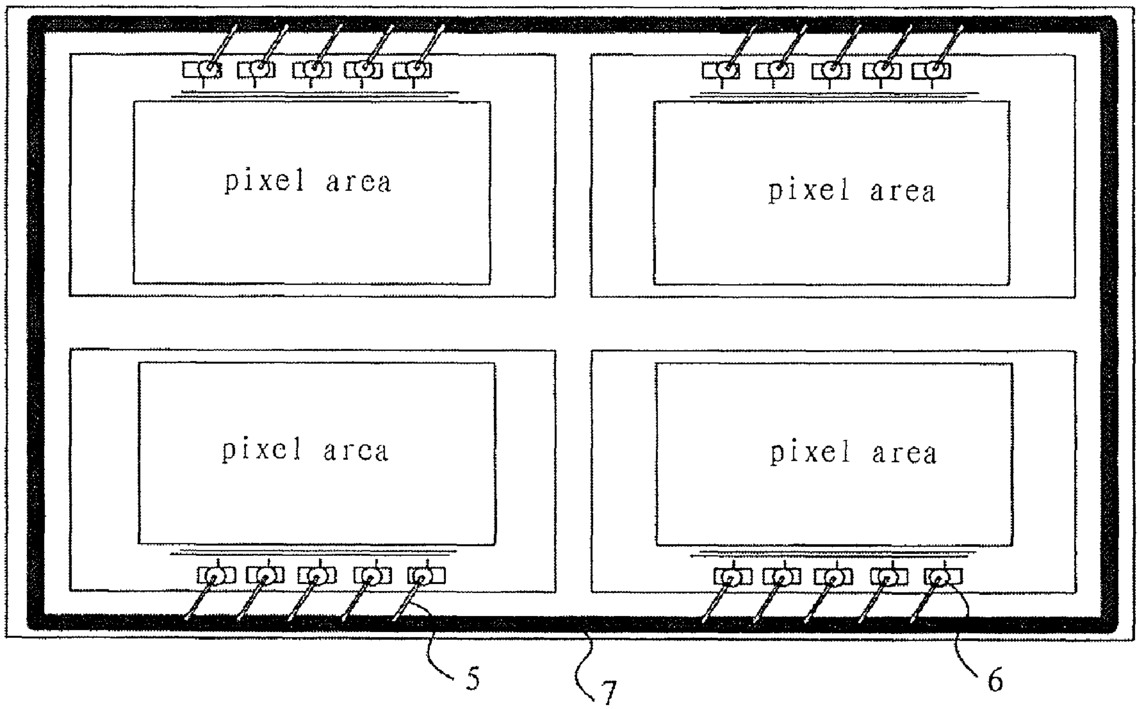
FIG. 7 is a schematic diagram of testing principle of the substrate testing circuit shown in FIG. 6.

Moreover, as shown in FIG. 7, during testing, the mode with symmetrical inputs is unnecessary and the mode of a single pad and single-side input is employed. Thus, it is easy to ensure that the input terminal pad 6 is in good contact with the probe pin 5 of the device. Besides, no beam 8 needs to be added in the middle of the device probe frame 7 due to not using the mode with symmetrical inputs. Therefore the tact time is reduced and production capacity is guaranteed.

At last, it should be noted that the above embodiments are only for purpose of explaining solutions of the present invention but not limiting the same. Although the present invention is described in detail with reference to the above embodiments, it should by understood by those skilled in this art that modifications may be made to the technical solutions described in the foregoing embodiments or some technical features therein may be substituted equivalently. Such modifications or substitutions will not render the corresponding solutions depart from the spirit and scope of various embodiments of the present invention in nature.

The invention claimed is:

1. A substrate testing circuit comprising a testing bus and a testing signal terminal connected to the testing bus, a signal line to be tested in the substrate being connected to the testing bus via a signal connecting terminal, characterized in that a plurality of signal access terminals are provided on the testing bus; respective testing branches are connected between the testing signal terminal and each of the signal access terminals; and resistance values of the testing branches are the same.

2. The substrate testing circuit of claim 1, characterized in that on the testing bus, length of the bus between adjacent two of the signal access terminals is less than 40 cm.

3. The substrate testing circuit of claim 2, characterized in that each the testing branch has a zigzag path with a different length so that the resistance values of the testing branches are same.

4. The substrate testing circuit of claim 2, characterized in that widths of the testing branches are different so that the resistance values of the testing branches are same.

5. The substrate testing circuit of claim 2 or 3, characterized in that the signal line to be tested in the substrate is a data line; the testing bus is a data testing bus; and the testing signal terminal is a data testing terminal.

6. The substrate testing circuit of claim 5, characterized in that the data line comprises data odd lines and data even lines; the data testing bus comprises a data testing odd bus and a data testing even bus; the data testing terminal comprises a data testing odd terminal and a data testing even terminal; the data odd lines and the data testing odd terminal are connected to the data testing odd bus; and the data even lines and the data testing even terminal are connected to the data testing even bus.

7. The substrate testing circuit of claim 2 or 3, characterized in that the signal line to be tested in the substrate is a gate line; the testing bus is a gate testing bus; and the testing signal terminal is a gate testing terminal.

8. The substrate testing circuit of claim 7, characterized in that the gate line comprises gate odd lines and gate even lines; the gate testing bus comprises a gate testing odd buses and a gate testing even bus; the gate testing terminal comprises a gate testing odd terminal and a gate testing even terminal; the gate odd lines and the gate testing odd terminal are connected to the gate testing odd bus; and the gate even lines and the gate testing even terminal are connected to the gate testing even buses.

9. The substrate testing circuit of claim 5, characterized in further comprising a common electrode terminal connected with a common electrode of the substrate.

10. The substrate testing circuit of claim 9, characterized in further comprising a static-electric-proof ring via which each the data line is connected with the common electrode.

11. The substrate testing circuit of claim 10, characterized in that the static-electric-proof ring is a TFT active level tunnel.

* * * * *